US009475690B2

(12) United States Patent
Sumant et al.

(10) Patent No.: US 9,475,690 B2
(45) Date of Patent: Oct. 25, 2016

(54) LOW-STRESS DOPED ULTRANANOCRYSTALLINE DIAMOND

(71) Applicant: UChicago Argonne, LLC, Chicago, IL (US)

(72) Inventors: Anirudha V. Sumant, Plainfield, IL (US); Federico Buja, Rotterdam (NL); Willem Merlijn van Spengen, Leiden (NL)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 14/283,098

(22) Filed: May 20, 2014

(65) Prior Publication Data
US 2016/0101974 A1    Apr. 14, 2016

(51) Int. Cl.
H01L 21/00    (2006.01)
B81B 3/00    (2006.01)
C23C 14/16    (2006.01)
B81C 1/00    (2006.01)

(52) U.S. Cl.
CPC ........... B81B 3/0024 (2013.01); B81C 1/0038 (2013.01); C23C 14/16 (2013.01); B81C 2201/013 (2013.01); B81C 2201/017 (2013.01); B81C 2201/0171 (2013.01); B81C 2201/0176 (2013.01)

(58) Field of Classification Search
CPC .................. G01P 15/0802; H01H 59/0009
USPC ..................... 438/50–54; 257/415
See application file for complete search history.

(56) References Cited

U.S. PATENT DOCUMENTS

| 5,916,456 | A | * | 6/1999 | Wort | ...................... C04B 41/459 117/929 |
| H1924 | H | * | 12/2000 | Zabinski et al. | ..... C23C 14/0605 204/192.11 |
| 7,602,105 | B2 | * | 10/2009 | Auciello | ................ G11C 11/22 310/311 |
| 2006/0060864 | A1 | | 3/2006 | Gerbi | |
| 2006/0175953 | A1 | * | 8/2006 | Swain | ................ C25B 11/0442 313/311 |
| 2007/0004325 | A1 | * | 1/2007 | Chang | ..................... C23C 16/27 451/443 |
| 2007/0220959 | A1 | * | 9/2007 | Sumant et al. | ................. 73/105 |
| 2008/0070049 | A1 | * | 3/2008 | Guo | ..................... C23C 16/0272 428/457 |
| 2008/0246368 | A1 | * | 10/2008 | Auciello et al. | ............. 310/321 |
| 2009/0148652 | A1 | | 6/2009 | Carlisle et al. | |
| 2010/0102291 | A1 | * | 4/2010 | Xu | ........................ G11C 13/02 257/4 |
| 2012/0182594 | A1 | | 7/2012 | Zhang et al. | |
| 2012/0193684 | A1 | | 8/2012 | Sumant et al. | |
| 2012/0256517 | A1 | * | 10/2012 | Bayram | ....................... 310/300 |

(Continued)

OTHER PUBLICATIONS

Berman, et al., "Surface science, MEMS and NEMS: Progress and opportunities for surface science research performed on, or by, microdevices," Progress in Surface Science, vol. 80, 2013, pp. 171-211.

(Continued)

Primary Examiner — Lex Malsawma
Assistant Examiner — Eric Jones
(74) Attorney, Agent, or Firm — Foley & Lardner LLP

(57) ABSTRACT

Nanocrystalline diamond coatings exhibit stress in nano/micro-electro mechanical systems (MEMS). Doped nanocrstalline diamond coatings exhibit increased stress. A carbide forming metal coating reduces the in-plane stress. In addition, without any metal coating, simply growing UNCD or NCD with thickness in the range of 3-4 micron also reduces in-plane stress significantly. Such coatings can be used in MEMS applications.

18 Claims, 22 Drawing Sheets

(56) References Cited

U.S. PATENT DOCUMENTS

2012/0280253 A1* 11/2012 Sung et al. ............ 257/77
2013/0161648 A1* 6/2013 Khan .................... 257/77
2013/0175546 A1* 7/2013 Khan .................... 257/77

OTHER PUBLICATIONS

Bhattacharyya, et al., "Synthesis and characterization of highly-conducting nitrogen-doped ultrananocrystalline diamond films," Applied Physics Letters, vol. 79, No. 10, Sep. 2001, pp. 1441-1443.
Buja, et al., "Electrically conducting ultrananocrystalline diamond for the development of a next generation of micro-actuators," Sensors and Actuators A, vol. 214, 2014, pp. 259-266.
Kim, et al., "Novel Ultrananocrystalline Diamond Probes for High-Resolution Low-Wear Nanolithographic Techniques," Small Journal, vol. 1, No. 8-9, 2005, pp. 866-874.
Miller, et al., "Routes to failure in rotating MEMS devices experiencing sliding friction," Proceedings of SPIE Micromachined Devices and Components III, vol. 3224, Sep. 1997, pp. 24-30.
Shamsa, et al., "Thermal conductivity of nitrogenated ultrananocrystalline diamond films on silicon," Journal of Applied Physics, vol. 103, No. 083538, 2008, 8 pages.
Zhu, et al., "A thermal actuator for nanoscale in situ microscopy testing: design and characterization," Jounal of Michromechanics and Microengineering, vol. 16, 2006, pp. 242-253.
Buja et al., "First adhesion measurements of conductive ultrananocrystalline diamond MEMS sidewalls." Proceedings of the 9th IEEE International Conference on Nano/Micro Engineered and Molecular Systems, Apr. 2014, 5 pages.
Guillen et al., "Mechanical characterization and stress engineering of nanocrystalline diamonds films for MEMS applications." Diamond &Related Materials 14 (2005) 411-415, Feb. 12, 2005, 5 pages.
International Search Report and Written Opinion for Application No. PCT/US2015/031610, mailed Sep. 3, 2015, 10 pages.
Naguib et al., "Enhanced nucleation, smoothness and conformality of ultrananocrystalline diamond (UNCD) ultrathin films via tungsten interlayers." Chemical Physics Letters 430(2006)345-350, Sep. 7, 2006, 6 pages.

* cited by examiner

Fig. 1A
$\sigma_1 < 0$
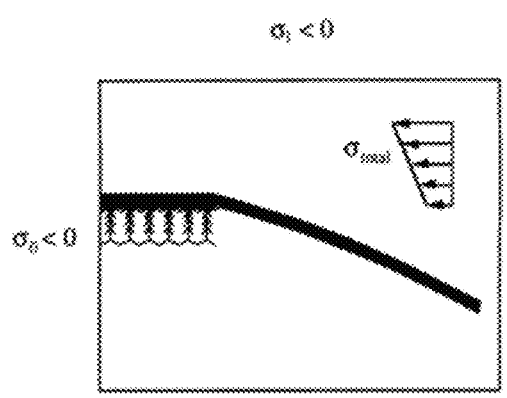
$\sigma_0 < 0$
Fig. 1B
$\sigma_1 > 0$
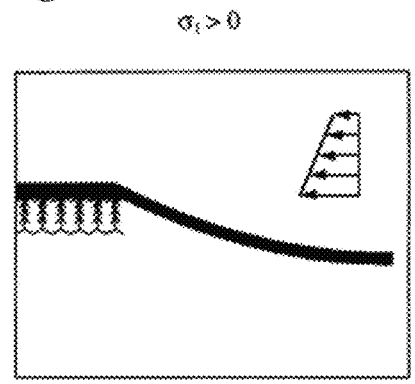
$\sigma_0 > 0$
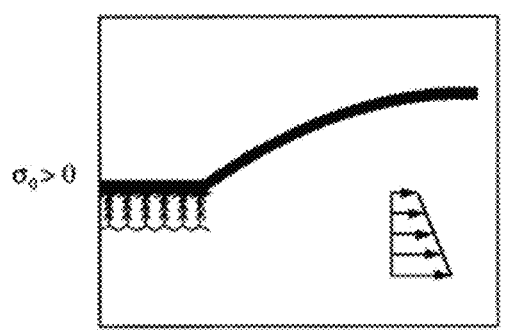
Fig. 1C
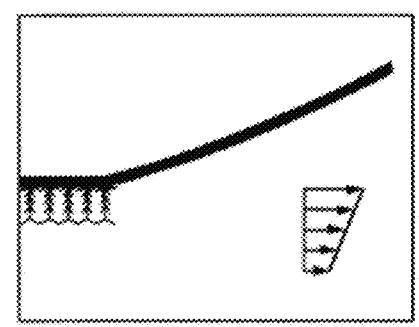
Fig. 1D
$\sigma_0$ = Residual stress
$\sigma_1$ = Stress gradient N-UNCD Un-released N-UNCD Released

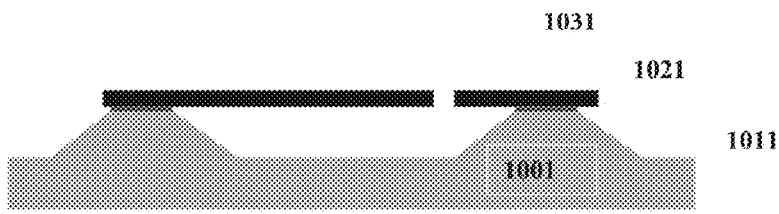
Fig. 10A
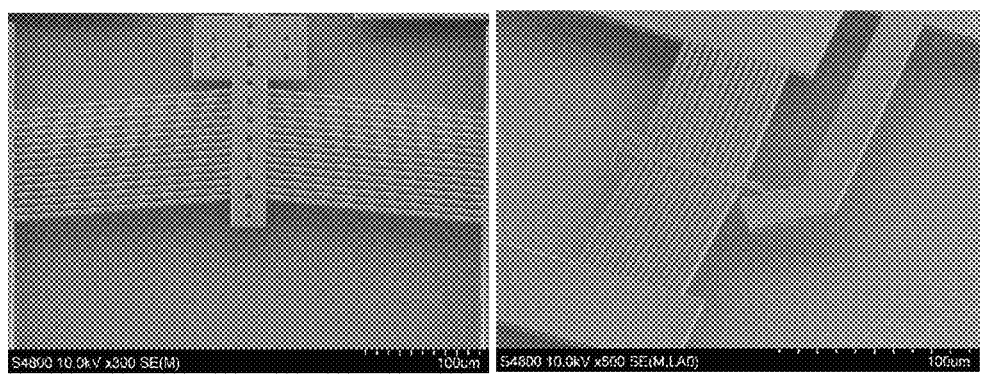
Fig. 10B
Fig. 10C
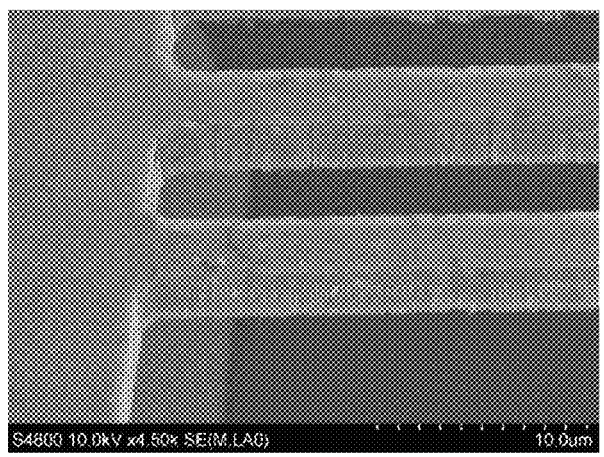
Fig. 10D

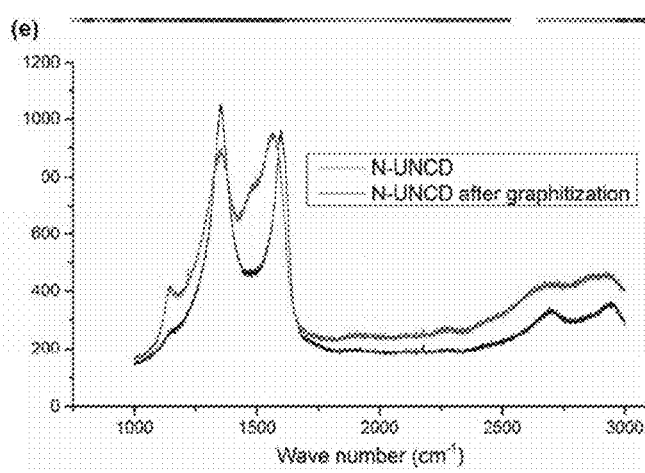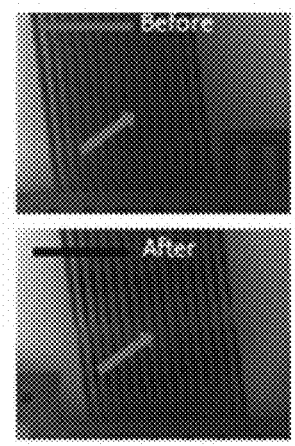
Fig. 15B
Fig. 15C
Fig. 15A

LOW-STRESS DOPED ULTRANANOCRYSTALLINE DIAMOND

STATEMENT OF GOVERNMENT INTEREST

The United States Government has rights in the invention described herein pursuant to Contract No. DE-AC02-06CH11357 between the United States Department of Energy and UChicago Argonne, LLC, as operator of Argonne National Laboratory.

FIELD OF THE INVENTION

The present invention generally relates small scale electromechanical systems; in particular micro-electro mechanical systems comprising ultrananocrystalline diamond.

BACKGROUND OF THE INVENTION

Efforts towards miniaturization have made great progress from the origin of integrated circuits to the development of micro- and nano-electromechanical systems. Recently, nano/micro-electro mechanical systems (MEMS) have found important uses in medicine, aerospace, and many other fields. The spread of these devices to new markets depends on their reliability and resistance under severe conditions. At present, MEMS can perform a variety of functions in diverse areas and, therefore, have a huge potential market, 4 but they are still limited by their structural properties and are often confined to work under restricted atmospheric conditions involving simple types of interactions and motion. The silicon-based MEMS technology, with its well established manufacturing base, is most popular in moving and bending (with no sliding interactions) types of devices but is ill suited for repeated sliding/rotation due to the poor mechanical and tribological properties of the silicon. When silicon surfaces come into contact, the result is inevitably the premature failure of the device due to excessive wear. Because of its poor tribological properties, silicon is not suited for rubbing or sliding motions between two contacting surfaces, and thus, silicon-based MEMS are not attractive for the development of new micro-systems for deployment in harsh environments or under moderate to heavy wear conditions. Additionally, these devices are not generally applicable where bio-compatibility is required. Extensive studies have been performed to reduce sliding friction and wear at the microscale, with particular attention to self-assembled monolayers and use of vapor-phase lubricants at the contacting interfaces. However, self-assembled monolayers have limited lifetime and do not survive at elevated temperatures, while vapor phase lubricants have a limited supply time with a low reachable maximum temperature.

The quest to overcome these limitations has been on finding an alternative material to silicon, one that not only has better mechanical and tribological properties but also is compatible with the standard MEMS processing techniques and, most importantly, has low intrinsic stress. Silicon carbide (SiC) has shown promise due to its better mechanical and tribological properties over silicon. However, issues remain with regard to the higher synthesis temperatures (<800° C.) for growing better quality crystalline SiC along with stress management, doping, and MEMS processing. A real revolution is represented by the recent introduction of a new material, ultrananocrystalline diamond (UNCD), which has outstanding tribological characteristics and excellent mechanical, chemical, and physical properties along with ease of MEMS fabrication. Although several devices incorporating a UNCD layer have been reported none have provided a stand-alone structural material in a thermal actuator.

To electrically actuate a MEMS device, it has to be electrically conductive. It is well known that UNCD thin films grown by using microwave plasma chemical vapor deposition (MPCVD) can attain almost semi-metallic electrical conductivity (~143 $\Omega$-1 cm-1) when grown with 20% nitrogen gas in the plasma. The nitrogen-incorporated UNCD (N-UNCD) film still retains good mechanical properties. These properties are significantly better than those of silicon and, therefore, make N-UNCD a promising candidate material for the fabrication of MEMS devices.

Despite excellent mechanical, chemical and electrical properties of diamond, one of the major hurdles in adopting diamond as a MEMS material is intrinsic stress. Particularly in case of nitrogen incorporated ultrananocrystalline diamond (N-UNCD), which has excellent electrical properties needed for the fabrication of electrically actuated MEMS/NEMS, but incorporation dopants causes increase in residual stress and therefore making this material not compatible for the MEMS fabrication.

Robust micro and nano actuators with precise control on displacement arc needed in various applications such as remote micro surgery, putting and placing small amounts of hazardous materials in environmentally harsh conditions. Current micro/nano~actuators based on silicon are not suitable for such applications due to the limitation on materials properties of silicon.

SUMMARY OF THE INVENTION

One embodiment of the invention relates to a method of fabricating a device. The method includes depositing a layer of a carbide-forming metal on a doped ultrananocrystalline diamond (UNCD).

In another implementation, a device is provided having a silicon base and an oxide layer. A conductive doped ultrananocrystalline diamond (UNCD) layer is also provided. The device further includes a titanium layer.

In another implementation, a nano/micro-electro mechanical (MEMS) device is provided. The MEMS device includes a non-conductive base. An conductive actuator is disposed on the non-conductive base, the actuator comprising nanocrystalline diamond (NCD). The doped UNCD and NCD films when deposited in the thickness range of 3-4 micron exhibits negligible in-plane stress.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which:

FIGS. 1A-1D illustrate stress scenarios.

FIG. 8A illustrates a rendering of the grain boundary structure for NCD while

FIG. 10A illustrates a fabrication schematic for an alternative MEMS structure fabricated in accordance. FIGS. 10B-D illustrate the micrographs of fabricated devices.

FIG. 11A shows a model of the micro-thermal actuator and stack of the micro-fabricated layers; FIG. 11B is a scanning electron micrograph of the device (false colors). Yellow: heating beams; green: central shuttle; blue: heat dissipating structures; purple: springs; red: solid anchors: grey: silicon substrate. Scale bar=100 μm.

FIG. 13A is a plot of the 4-point probe measurement on N-UNCD. The red line represents the voltage drop between the two inner electrodes, without contact resistance, the inset shows the geometry adopted for the 4-point probes measurement on diamond; FIG. 13B shows resistance change as a function of temperature. The quasi-linear trend allowed us to extract the TCR curve; FIG. 13C is a Raman spectra of N-UNCD at 23° C. and 550° C. Data show a shift toward lower wavenumbers when the temperature increases, with minor modifications of the spectrum shape.

FIGS. 14A-D shows optical images of the laser spots that were used for the local temperature assessment with micro-Raman spectroscopy; FIG. 14E is a Raman spectrum change due to the structural modification after failure (above 600° C. at 200 mW of input power).

FIGS. 14A-D show the four locations where the temperature was monitored by analyzing the Raman spectrum shift (Rs).

FIG. 15A shows the Raman spectra, taken on the beams, before (FIG. 15B) and after (FIG. 15C) failure.

FIG. 16A is a plot of the central shuttle displacement up to a maximum input power of 180 mW, which corresponds to the limit at which the device almost fails; FIG. 16B is a plot of the displacement obtained with a smaller device at a maximum power of 56 mW; FIG. 16C shows the hysteresis effect between forward and backward actuation due to the degradation of the slender beams at an input power of 210 mW.

FIG. 17A is a Ti/N-UNCD device released. FIG. 17B is an example of the device's geometry: $L_A$ and $L_B$ represent the arms, O is the junctions' offset, $L_C$ the main beam length and W is the width. The rotation is driven by the O parameter.

DETAILED DESCRIPTION OF THE PREFERRED EMBODIMENTS

Figure 2A:
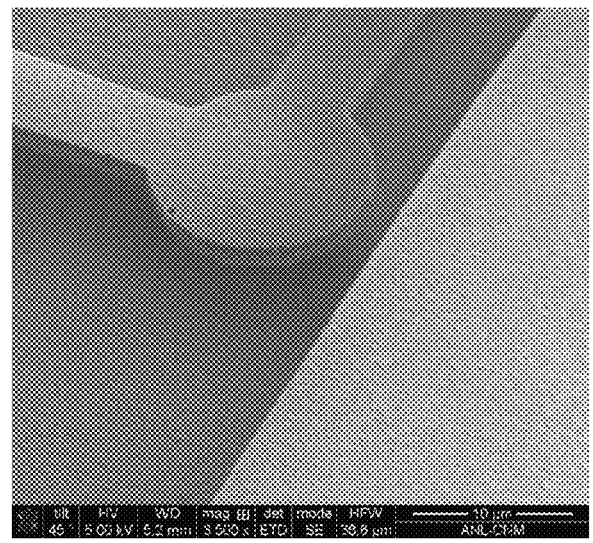
FIG. 2A illustrates N-UNCD in an unreleased state and FIG. 2B illustrates N-UNCD in a released state.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Mechanical MEMS are limited by the silicon's low hardness, low fracture toughness, high friction, and non-biocompatibility. Diamond solves these problems but in has only been able to be applied on something else and with displacement limited to tens of nanometers. Electrical conductivity is critical and nitrogen-doped UNCD (N-UNCD) provides this capability, but at the cost of internal stresses that warp devices when they are released from their underlying sacrificial layer.

It has been seen that there is a noticeable difference between intrinsic stress in UNCD and nitrogen incorporated UNCD (N-UNCD). In fact, the stress gradient, that arises from the mismatch in substrate/layer temperature, and grain sizes distribution, shows different values for the two different cases, and is much higher for N-UNCD. In case of nitrogen incorporation the measured stress is 4 times higher than the undoped material.

The incorporation of nitrogen, that preferentially ends up at the grain boundaries of the UNCD, results in a achieved conductivity of ~260 $\Omega cm^{-1}$, and it is essential in order to fabricate electrostatic and thermo-electro micromechanical devices. It is believed that the change of grain boundary width, along with increased sp2 phase, play a major role in the cause of higher degree of stress in this material.

The main step is to evaluate the magnitude of the stress gradient, and find a solution to overcome or balance it, in order to develop devices that can maintain an acceptable degree of flatness after release. The vertical displacement upon release should be so small that doesn't compromise the interaction between the two sliding test surfaces in a friction experiment.

The present application describes a method for growing N-UNCD. In one implementation, it was discovered that growing N-UNCD film to 3-4 micron thickness (with a reasonable growth time period) resulted in a virtual stress-free film. Further described herein is a thermal actuator fabricated from electrically conductive, nitrogen-incorporated UNCD and has a maximum displacement in the micron range and a positioning precision in the sub-nanometer range.

Diamond MEMS also provided comparable costs, through use of chemical vapor deposition, to silicon wafers. Diamond MEMS benefit from the ability to fabricate without the need for a special ultraclean room. Further, diamond MEMS can be used in a wide range of applications, including in CMOS applications.

One method of synthesis of nitrogen incorporated UNCD (N-UNCD) involves:

Incorporation of nitrogen (~20% by volume) into the Ar/CH$_4$ plasma

Nitrogen concentration <1 at. % in the film

Increase in grain boundary width and grain size

Precipitation of graphitic phase at the grain boundary

Electrical conductivity (~260 $\Omega^{-1}$cm$^{-1}$)

For one method of synthesis, see Synthesis and characterization of highly-conducting nitrogen-doped ultrananocrystalline diamond films Appl. Phys. Lett. 79, 1441 (2001);

In one implementation, the present invention relates to method for fabricating all diamond MEMS device. Methods are described to reduce residual stress enabling N-UNCD suitable for the fabrication of complex MEMS/NEMS devices. In one implementation, an opposite external load is applied to the diamond layer, which is affected by a compressive stress gradient. This load is exerted by a sputtered titanium layer, typically under tensile stress after deposition. By literally 'pulling' the structures up, it was possible to bring back the required flatness to the diagnostic cantilevers, and hence develop a solution to implement in the fabrication of working devices.

In a first implementation, the method utilizes a thin metal coating of a carbide forming metal, such as, for example, titanium, zirconium, hafnium, vanadium, niobium, tantalum, chromium, molybdenum, and tungsten, over N-UNCD providing tensile stress to reduce the total residual stress to half. In one implementation, optimizing deposition condition to control the thickness of N-UNCD reduces to residual stress to near zero. In one implementation, for 1000 nm of N-UNCD the carbide coating is about 50 nm. The carbide-forming metal can be deposited such as by sputtering or e-beam evaporation. The MEMS production may involve only a top down approach, using hard SiO$_2$ mask for diamond RIE (reactive ion etching) and XeF$_2$ for the final device release.

In an another implementation, the same method can be applied to nanocrystalline diamond and boron doped nanocrystalline diamond to reduce the residual stress to minimum value. The boron doping in UNCD can be achieved by introducing boron during growth (boron source could be B$_2$H$_6$ gas of trimethyl boron vapors using Ar carrier gas). As long as the grain size of diamond is in NCD or UNCD regime (10-50 nm to 2-7 nm), and the diamond could be conducting, by adjusting the thickness of diamond (3-4 micron), one can control the stress in diamond layer.

As noted, stress is an important limiting factor when considering the use of N-UNCD as a material for MEMS devices. In order to expand the applications in which UNCD, especially N-UNCD, can be utilized, it is necessary to control the stress in the N-UNCD. FIG. 1 illustrates stress scenarios. $\sigma_0$=Residual stress and $\sigma_1$=Stress gradient, where:

$$\sigma_1 = \frac{\partial \sigma}{\partial t} = \frac{E}{(1-v)} \cdot \frac{2}{l^2} \cdot \delta \quad \text{(Equation 1)}$$

Figure 2B:
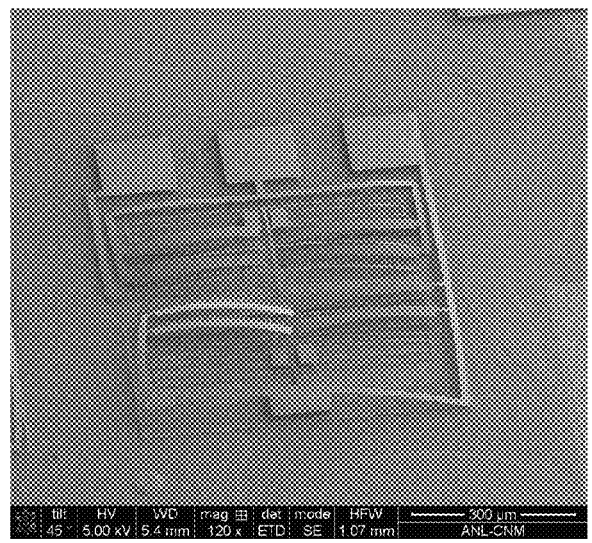

The performance of N-UNCD in unreleased and released states is shown in FIGS. 2A and 2B respectfully.

The problem presented by doped UNCD is the stress gradient. For example, the higher stress gradient performance of doped (N-UNCD) vs undoped in certain tested samples is listed below in table 1.

TABLE 1

| Comparison of stress gradient: UNCD vs N-UNCD | | |
|---|---|---|
| | Undoped UNCD | N-UNCD |
| Thickness | 1.2 μm | 1.2 μm |
| Cantilever length | 90 μm | 90 μm |
| Deflection | 0.5 μm | 2.1 μm |
| Stress Gradient | 120 MPa | 516 MPa/μm |

Figure 3A:
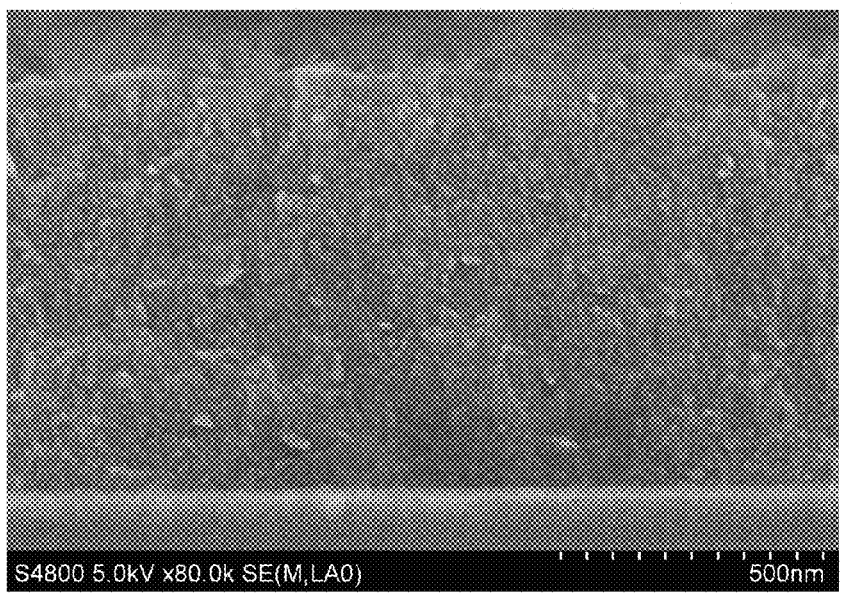
FIGS. 3A and 3B show a titanium coating (~50 nm) on a N-UNCD layer (~800 nm) (@ 90 um→~1 μm vertical shift Stress gradient: 187.5 MPa/μm).
Figure 3B:
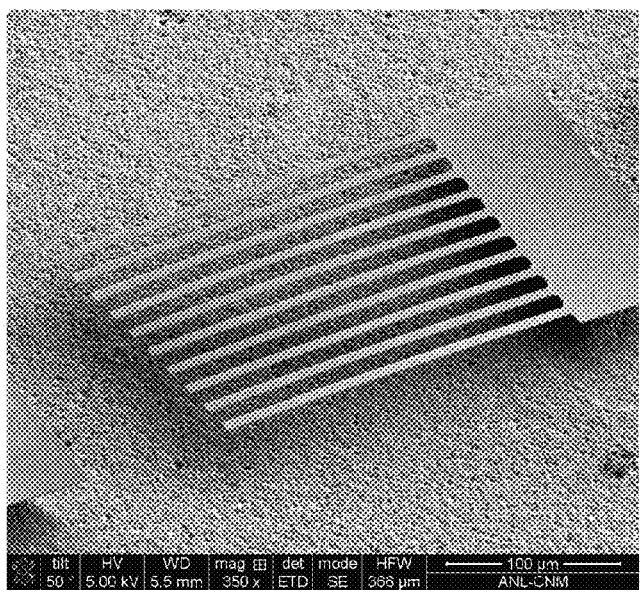

In one implementation, a method is provided whereby the N-UNCD is coated with a thin coating of titanium. FIGS. 3A and 3B show a titanium coating (~50 nm) on a N-UNCD layer (~800 nm) (@ 90 um→~1 μm vertical shift Stress gradient: 187.5 MPa/μm).

Figure 4A:
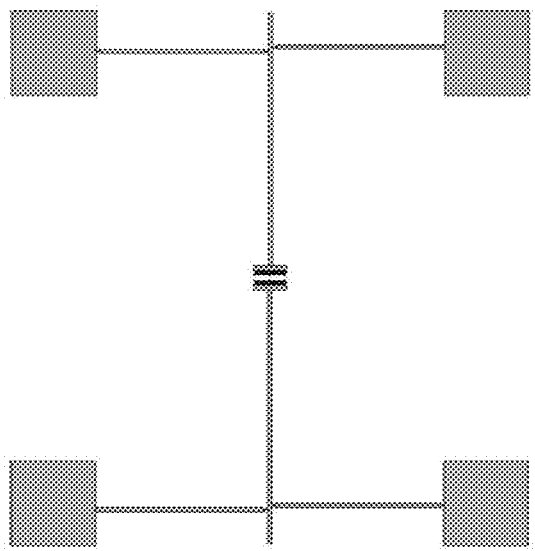
FIGS. 4A-B illustrate in-plane stress for one implementation.
Figure 4B:
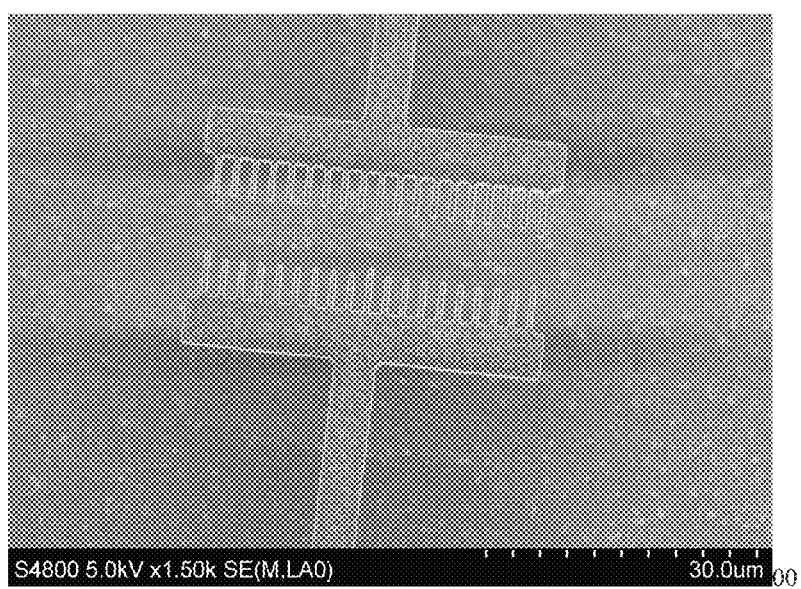
Figure 5:
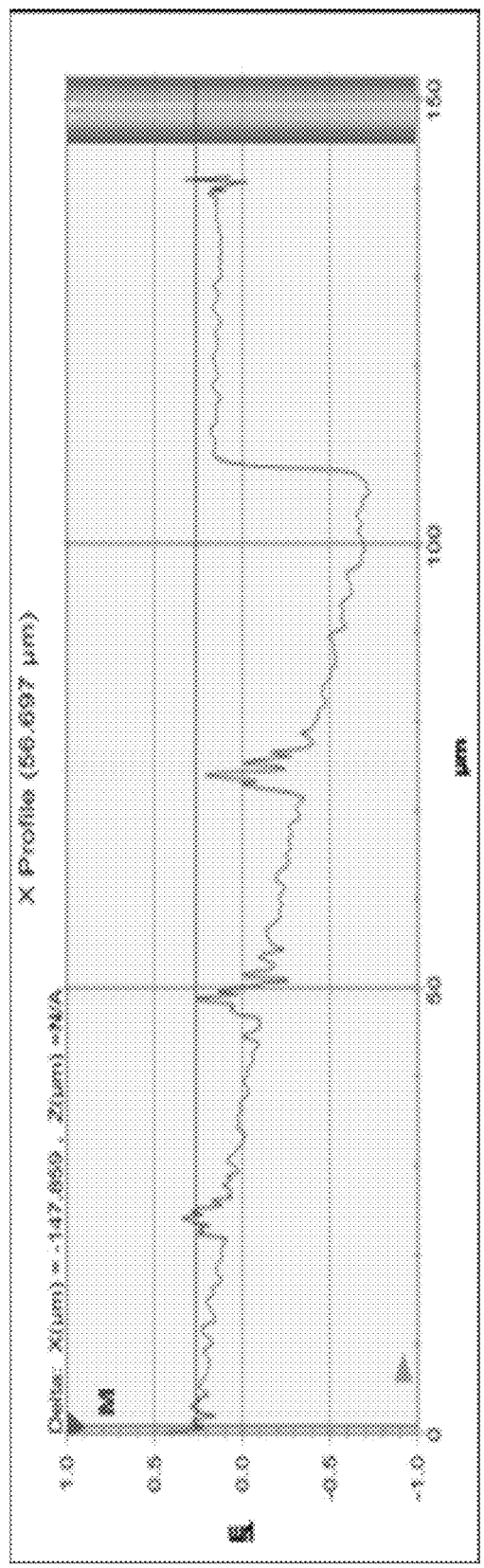
FIG. 5 illustrates the out-of-plane displacement.

One benefit of the Ti-coated N-UNCD is that it exhibits negligible in-plane stress, i.e. the stress is near zero. FIGS. 4A-B illustrate in-plane stress for one implementation. In particular, the Ti-coated N-UNCD is used for construction of moving MEMS. FIG. 5 illustrates the out-of-plane displacement. At 105 μm 0.7 μm of deflection is observed. The result is about 120 MPa/μm stress gradient.

Figure 7A:
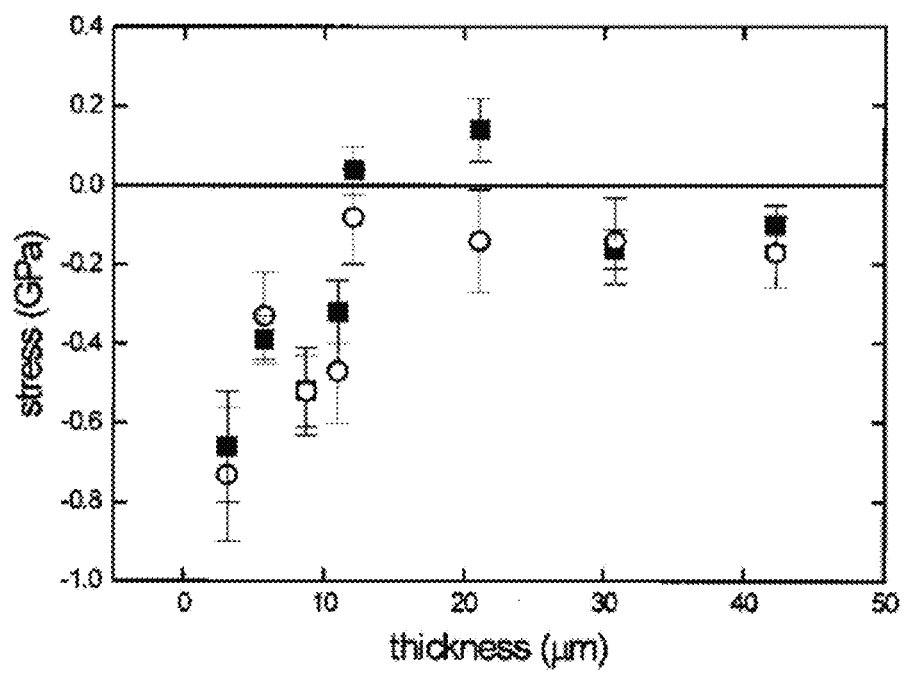
FIG. 7A illustrates the thickness depending stress variation observed in NCD and FIG. 7B illustrates the thickness depending stress variation observed in N-UNCD.
Figure 7B:
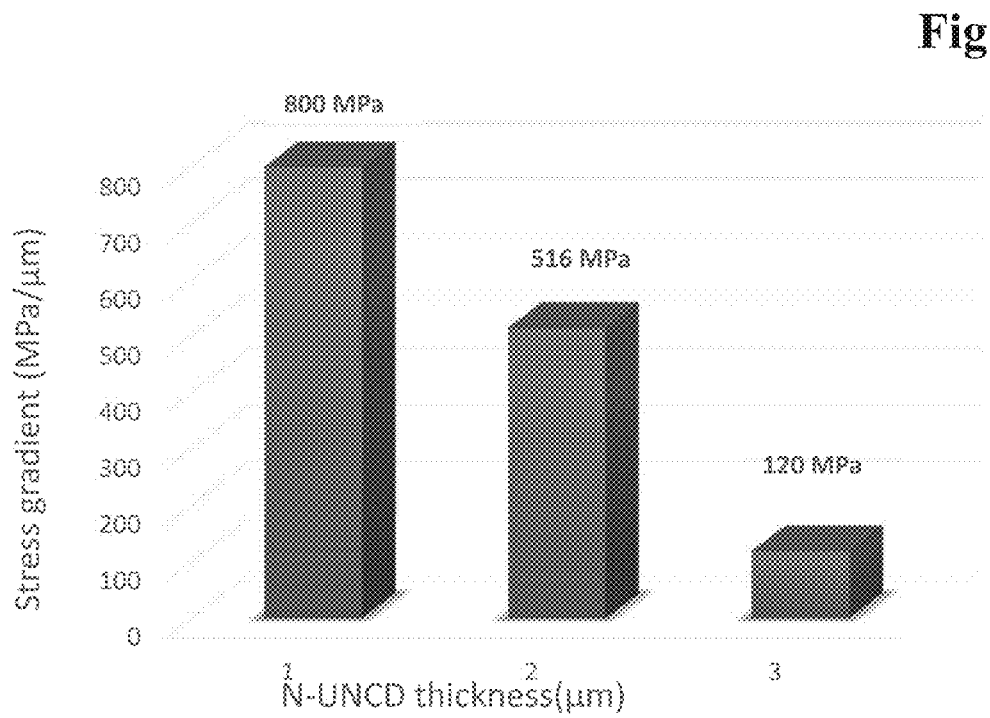
Figure 8A:
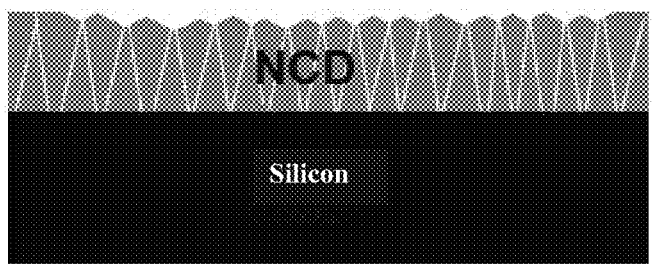
Figure 8B:
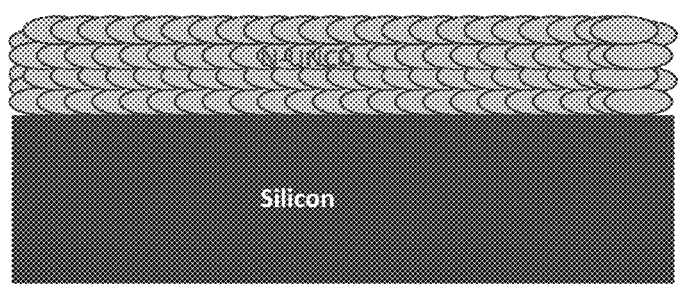
FIG. 8B illustrates that for N-UNCD.

Thickness is also known to impact the stress variation in microcrystalline MCD. FIG. 7A illustrates the thickness depending stress variation observed in MCD as reported in the prior (J. appl. Phys, 91(4), 2466 (2002)). It is believed that MCD exhibits increased stress with increased layer thickness because of its columnar growth morphology. That is, the layer's thickness results in vertical grown of grains with vertical grain boundaries. In contrast, the N-UNCD surprisingly exhibits the opposite correlation between stress and thickness. FIG. 8A illustrates a rendering of the grain boundary structure for MCD while FIG. 8B illustrates that for N-UNCD. It is believed that the grain size is unaltered as thickness increases because of the different morphological structure which results in an increase in grain boundary fraction of the overall volume increasing. FIG. 7B illustrates the thickness depending stress variation observed in N-UNCD.

Figure 9:
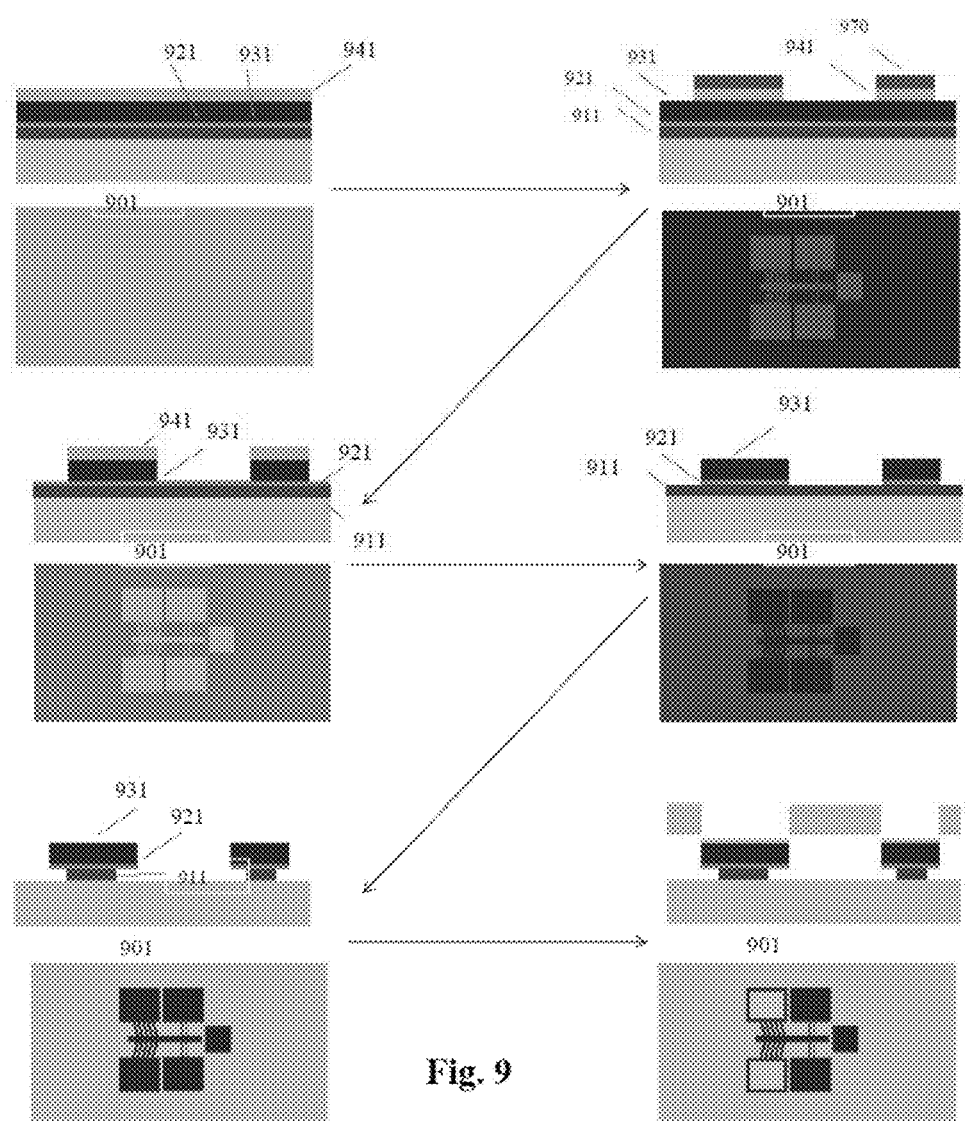
FIG. 9 illustrates one process flow for a fabrication of a chevron device.

In one embodiment, a MEMS device is created by deposition and etch. FIG. 9 illustrates one process flow for a fabrication of a chevron device. A silicon base layer 901 has a layer of silicon dioxide 911, followed by tungsten 921, then the UNCD layer 931 with a top layer of Al 941. A resist 970 is provided and the remaining aluminum is removed. Successive etches of the UNCD, tungsten, and silicon dioxide layers form the MEMS with a layer of gold 951 deposited following etch. It will be appreciated that these represent the standard layers for a MEMS fabrication. For example, SiO$_2$ layer is used as a sacrificial layer so that MEMS devices could be released and SiO$_2$ being insulating isolates the conducting diamond from the base substrate, which is Silicon. One can also think of depositing N-UNCD directly on high resistive silicon and then etch Si using XeF$_2$ (generally 2-3 micron etching is sufficient to release the MEMS devices). In one implementation, all layers are deposited including Ti (or other carbide forming metal) on top sequentially and later using Ti as a mask to etch diamond (reactive ion etching of diamond in O2 plasma) and then Ti etching using acid or RIE etching FIG. 10A illustrates a fabrication schematic for an alternative MEMS structure fabricated in accordance. FIGS. 10B-D illustrate the micrographs of fabricated devices. An etching rate of ~65 nm/min to a thickness of 3300 nm was achieved with TMAOH @ 85 deg. Celsius for release. A thermal actuation experiment for the MEMS device shown in FIG. 10C was performed. Horizontal displacement of 520 nm was observed with displacement resolution down to 10 nm.

Figure 6A:
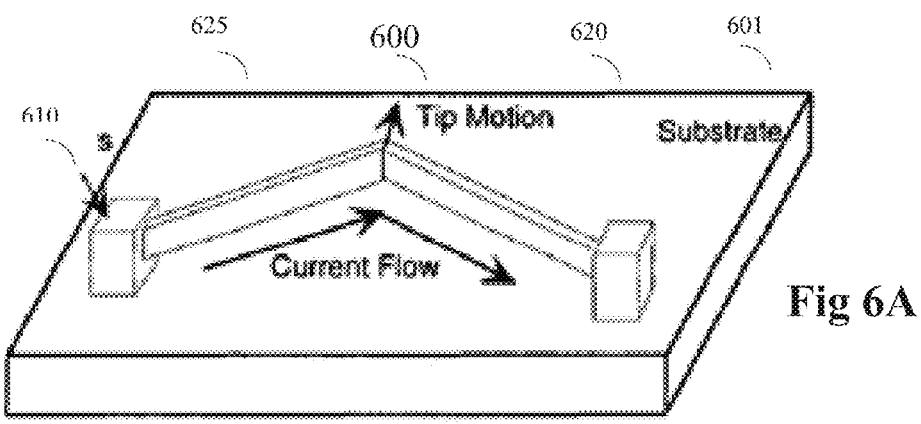
FIG. 6A is a schematic of a single chevron-type device and FIG. 6B is a rendering of a chevron-type thermal actuator.
Figure 6B:
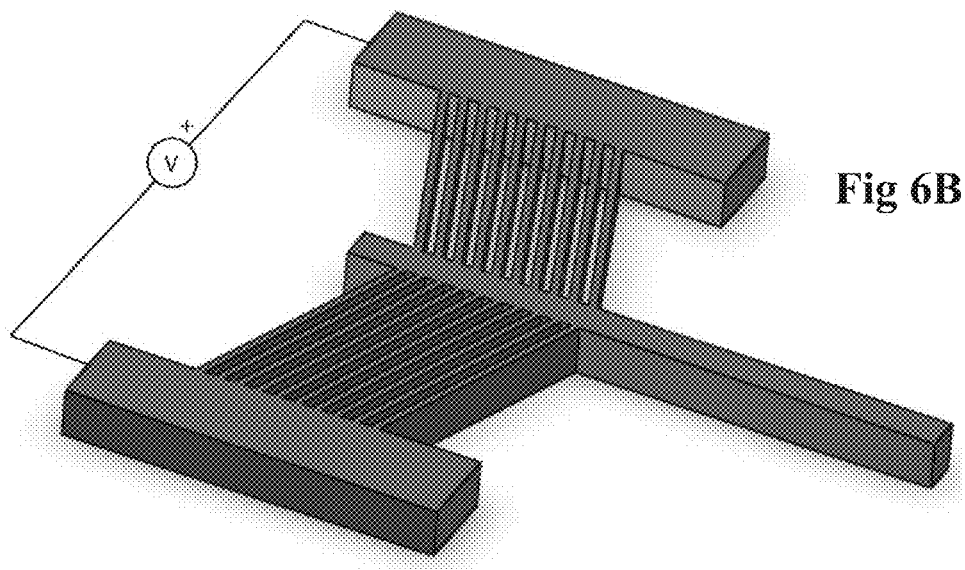

Various MEMS devices may be fabricated using the methods described herein. For example, capacitive comb drives or thermal actuators. For applications where the MEMS has sliding surfaces, an all-diamond structure is preferred. In one implementation, a chevron-type thermal actuator can be constructed. FIG. 6 shows one such implementation. The device 600 includes anchors 610 at two locations on a substrate 601 with a chevron-shaped bridge 620 between having an apex 625 that exhibits motion when current flows from one anchor 610 through the bridge 620 to the other anchor 610. The Joule heating effect is observed and large force and displacement, relative to size, is obtained.

In one implementation, maximum displacement up to 8 micron is achieved with minimum step resolution down to 0.4 nm. The stress gradient of 516 MPa/um mentioned in Table 1 above is for 1 um thick N-UNCD without Ti deposition. Where 50 nm of Ti was deposited, the results showed a 200-235 MPa/um stress gradient.

In one implementation, a tribometer-on-chip is fabricated for studying fundamental tribological properties of diamond at MEMS length scale.

In one implementation, N-UNCD is combined with un-doped UNCD, that has zero stress, to create "layered pan-cake" devices.

In another implementation, dopants may include one or more of nitrogen, boron, and phosphorous.

In one implementation, MEMS devices comprising N-UNCD include activation modes of sliding activation. Sliding activation is a desirable application because that will increase the wear life using diamond. The sliding may be lateral or up and down (perpendicular or out of plane motion). The lateral motion can be translated to other possible configuration such as rotation by using gear assembly (gears could also be made of diamond).

EXAMPLE

Stress Gradient Assessment

Diagnostic cantilever structures were used to assess the stress gradient in the deposited material, by monitoring the way they bend. In order to evaluate the height difference of the cantilever's tips, a Wyko NT 3300 white light interferometer (WLI) was used. The transparency of diamond can affect this type of measures and the data outcome. To avoid this, the WLI scan has been limited to the top surface of the cantilevers, to detect its modification and flatness.

With interferometry technique, at 90 μm cantilever's length, a ~1 μm deflection in vertical direction was measured for the Ti/N-UNCD stack, while it was ~2.1 μm for the N-UNCD. Those are the values expressed in term of stress gradient, always compressive in the studied cases. For the calculation of the actual stress in the layer of interest is important to know the thickness. For this research the film thicknesses deposited are: 0.8 μm for UNCD and Ti/N-UNCD and 1.2 μm for the N-UNCD. These values are known by the deposition rate, that for UNCD is approximately 200-250 nm/hour. Modification of this parameter can be caused by many factors, especially if the deposition temperature is slightly different than 850° C. Following is reported a table in which are shown the values obtained by measuring the cantilevers deflections with the WLI.

TABLE 2

Stress gradient calculation based on the deflection observed with White Light Interferometry on different samples.

| Material | Out of plane deflection (μm) | Stress gradient (MPa/μm) |
|---|---|---|
| UNCD | 0.5 | ~128 |
| N-UNCD | 2.1 | ~495 |
| Ti/N-UNCD | 1 | ~235 |

N-UNCD alone, in the thickness range that was studied, is not suitable due to the compressive stress for the intended application. However, remarkable improvement was observed in the stress gradient after depositing a thin layer of Ti on top of N-UNCD. The overall stress gradient is almost as low as that of undoped UNCD.

EXAMPLE

In-plane Stress Assessment

Figure 17A:
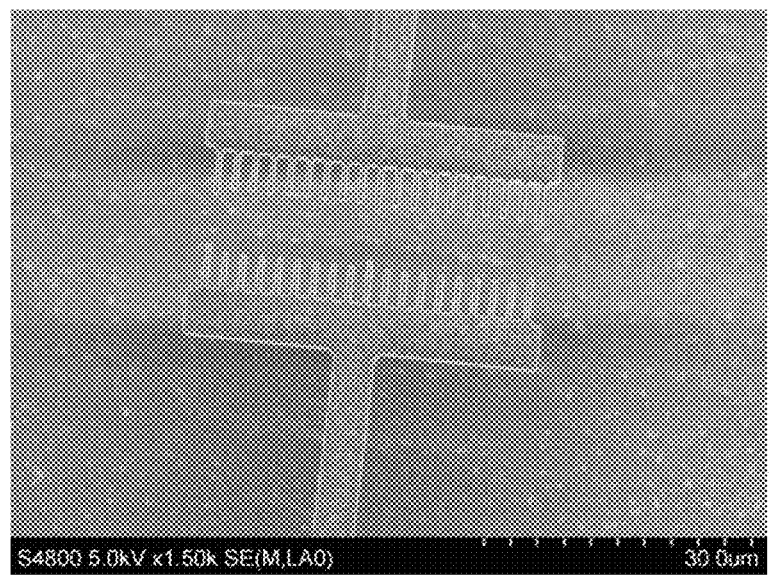
FIGS. 17A-B show a in-plane beam structure for compressive and tensile stress analysis.
Figure 17B:
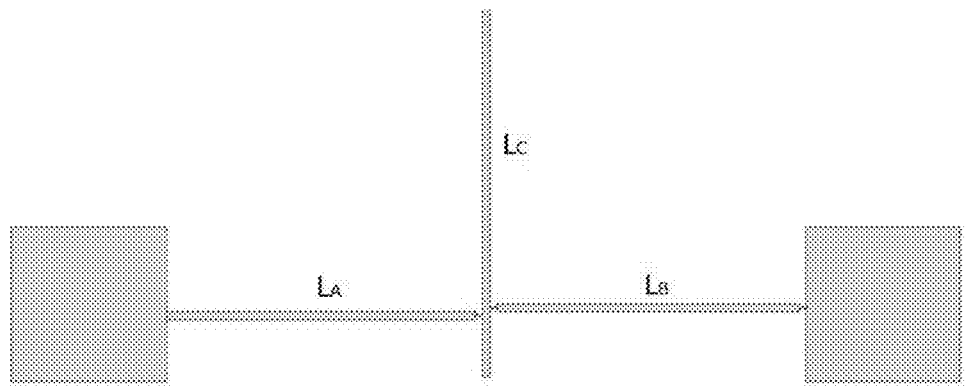

For the evaluation of the in-plane stress component in the material, a dedicated structure has been included in fabrication process (FIG. 17A). In the picture of 17B the perfect alignment of the Vernier's scale designed on the device is visible, which reveals that no counter motion of the indicators has taken place, and hence that there is no stress acting on the joints of the device, and so no in plane stress.

EXAMPLE

N-UNCD Micro-thermal Actuator

In another implementation, microactuators, such as those fabricated according the previously discussed methods, include electrically conducting ultrananocrystalline diamond. In one example, it has been demonstrated that fabrication and actuation of an N-UNCD micro-thermal actuator is possible by using standard optical lithographic techniques. The output displacement and temperature profile of a Chevron-type micro-actuator, fully fabricated out of N-UNCD, was characterized. At extreme displacements, structural modifications occurred due to the temperature increase, as determined by micro-Raman spectroscopy.

Figure 11A:
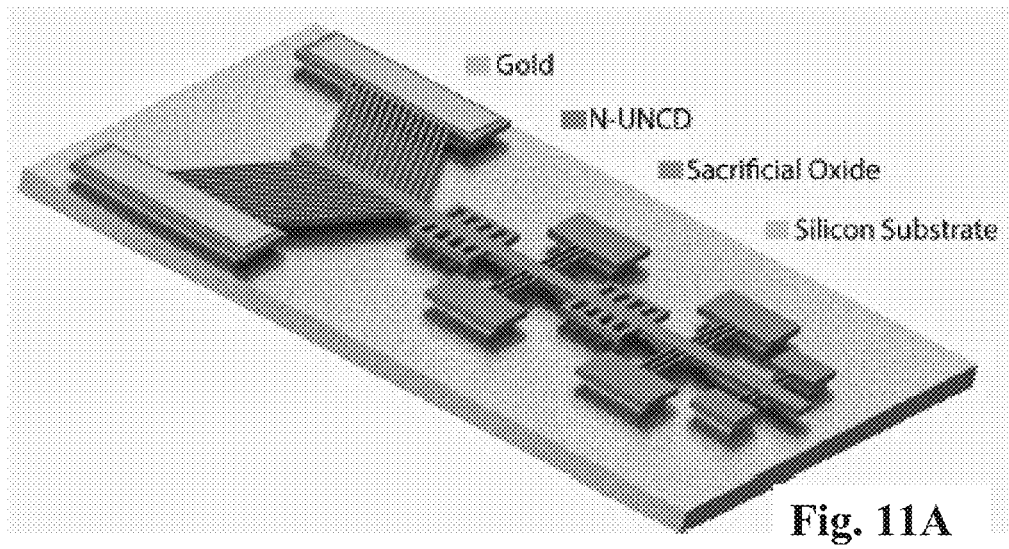
FIGS. 11A-B relate to graphical simulation and geometrical characteristics of the N-UNCD MEMS.
Figure 11B:
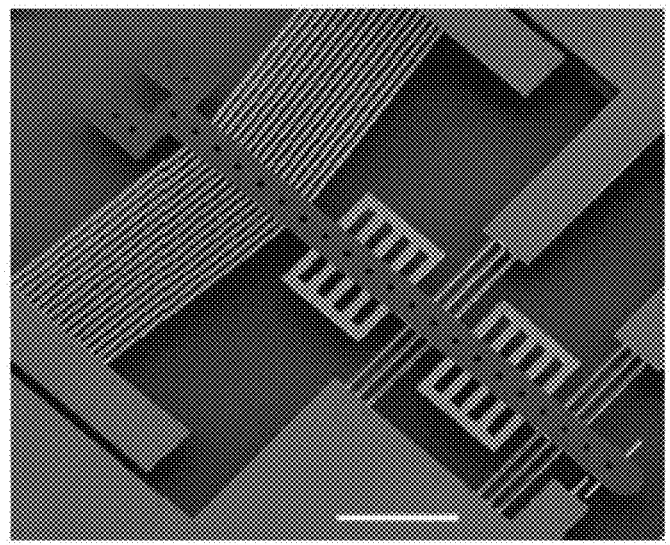

In one implementation, a Chevron-type (or V-shaped) micro-actuator (see FIGS. 11A-B) consists of counteracting slender beams that thermally expand under the Joule heating effect and provide displacement and force on a central moving body. The Chevron-type micro-actuator was fabricated using N-UNCD as the structural material and the general fabrication outline in FIG. 9. The moderate electrical conductivity of N-UNCD, its ability to tune internal stress, and its low thermal expansion coefficient and the low thermal conductivity are the reasons for the excellent results obtained.

Figure 12A:
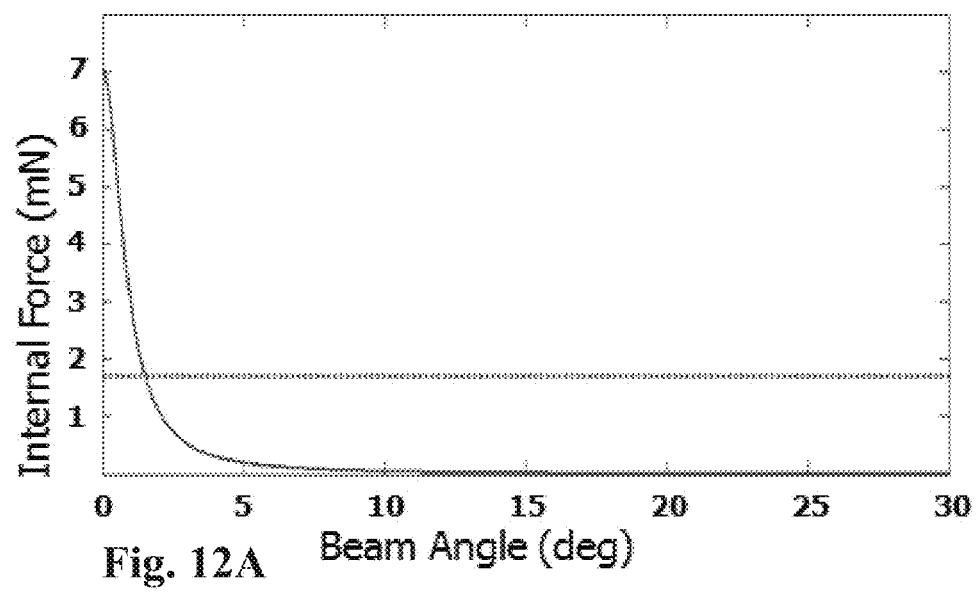
FIG. 12A shows a numerical simulation of the buckling force (blue-dashed line) and the internal force generated in the device (red line) and FIG. 12B is a numerical simulation of the maximum shuttle displacement as a function of the angle between the shuttle and the 200-μm long slender beams.
Figure 12B:
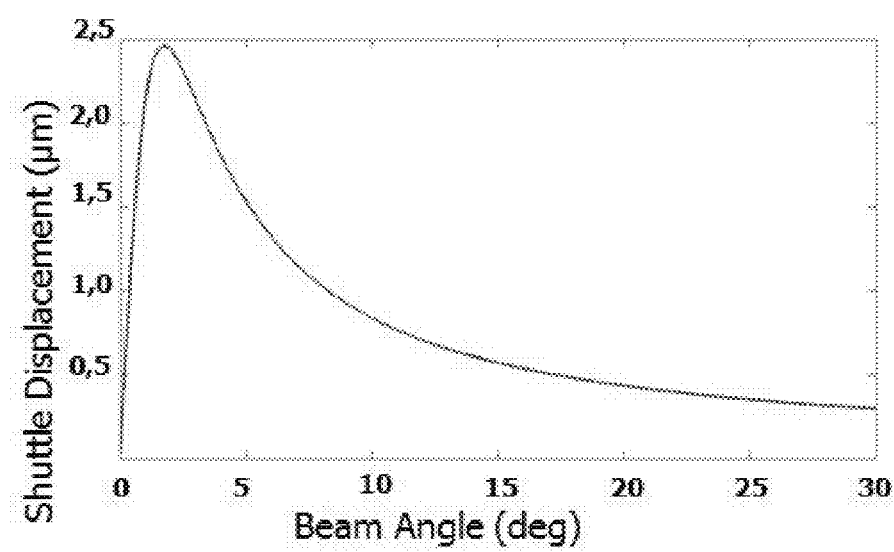

Simulated data was generated to determine the optimum parameters for an MEMS device based on the described method. FIG. 12A is a graph indicating the maximum displacement for a simulated optimal angle design. FIG. 12B illustrates the minimum angle below buckling point for such a simulated design. FIG. 12C illustrates a simulation of the horizontal resonance frequency for a MEMS. The horizontal resonance frequency is 430 kHz.

The maximum achievable displacement of the shuttle and force output of the system are directly linked to the length, number, and angle of the slender beams with respect to the central body: the device is built with 90-μm and 200-μm long beams. The optimum angle of the driving beams was evaluated with respect to the shuttle displacement and internal force (FIGS. 12A and 12B) while also keeping an eye on the possibility of out-of-plane buckling of the beams. By optimizing the driving beam dimensions, one is able to determine the maximum range of actuation from nano- to micrometers and, therefore, adapt the device to a particular application.

The fabrication method is completely based on standard lithographic techniques, though adapted to the use of N-UNCD as described above. A 3.3-μm-thick flat N-UNCD film was deposited on silicon substrate (with 300-nm-thick $SiO_2$ used as a sacrificial layer), then etched through a 1-μm-thick pure aluminum mask by using an $O_2$-based plasma at a power of 500 W. An outstanding characteristic of UNCD is its inertness with respect to most acids and bases due to the high strength of the covalent bonds. The vapor release process is, therefore, much easier to apply than in standard silicon processing. A first vapor hydrofluoric acid release (40% HF at 42° C.) was performed in order to etch the silicon dioxide area underneath the anchor points and free all other structures. To avoid stiction or contact with the substrate and accommodate any possible deformation due to a stress gradient, a deep underetch was performed by immersion of the UNCD wafer in tetramethylammonium hydroxide (TMAOH) at 85° C., which removes the unwanted silicon underneath. All fabrication steps are shown in FIG. 9.

Experiments were performed to confirm the semi-metallic nature of the N-UNCD and derive its characteristics as a structural material for MEMS. It should be appreciated that other methods than discussed herein for the experiments may be used to create the diamond layer. For example, ion implantation is another way of making diamond conducting. This involves post annealing at relatively high temp (700-800 C) to activate the dopants. It is believed that any suitable implantation method could also be used to make diamond conducting and use for MEMS fabrication as long as the grain size of diamond is in NCD or UNCD regime and the thickness in 3-4 micron.

The in-situ incorporation of nitrogen during UNCD growth offers several advantages over the conventional ion implantation process to achieve semiconducting properties. The incorporation of nitrogen into the grain boundaries, as well as the formation of sp2-bonded clusters at the grain boundaries, has been shown to be the main source of the enhanced electrical conductivity in N-UNCD. The even distribution through the entire film results in uniform electrical conductivity. With ion implantation, by contrast, there is always a risk of structural and phase modification due to the ion-induced damage leading to an increased amount of sp2-bonded graphitic phases. Moreover, dopant atoms are always restricted to a certain depth depending upon ion energy, and they need to be annealed at higher temperatures (~1000° C.) to evenly redistribute and become electrically active. Because the corresponding structural modification would affect their mechanical properties, ion implantation is not a feasible process for N-UNCD-based structures. Stress distribution is another concern that could arise after ion implantation.

Figure 13A:
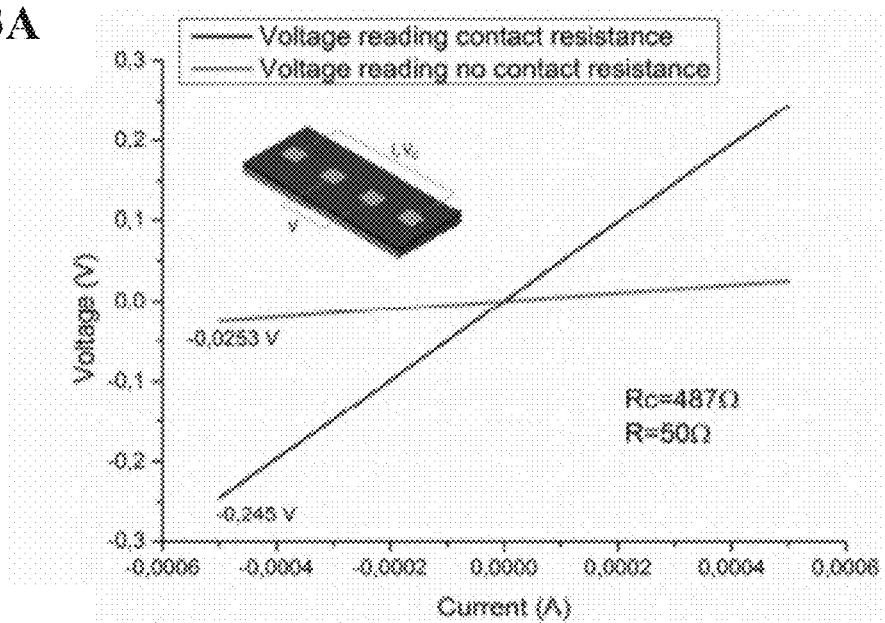
FIGS. 13A-C relates to electrical and thermal characterization of N-UNCD.
Figure 13:
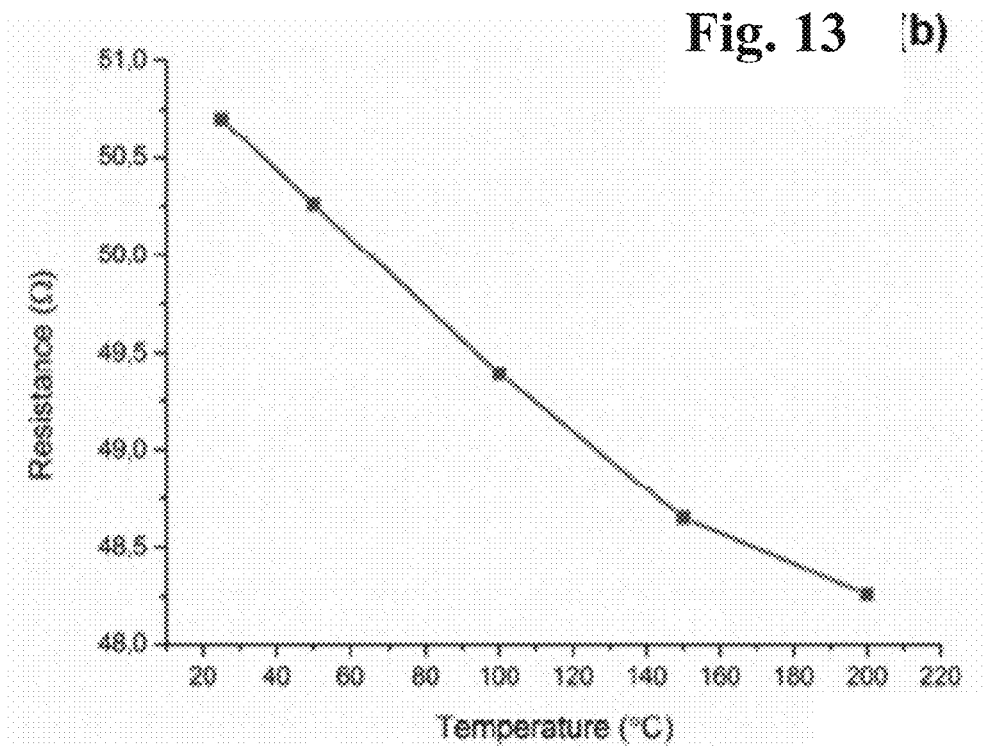
FIG. 13D is a plot of the Dband Raman shift with increasing temperature.

The N-UNCD electrical resistance was measured with increasing temperature in order to determine the temperature coefficient of resistivity (TCR). Four Au/Cr (200 nm/10 nm thick) square pads were evaporated in a line on a N-UNCD layer, insulated by a 350-nm $SiO_2$ layer from the silicon substrate. Electrical resistance was determined by the 'four point probe' technique, where two probes measured the current flow between the outermost electrodes, while the other two sensed the voltage drop between the inner ones (inset in FIG. 13A). By this means, the probe contact resistance is not part of the measurement. The probes (gold squares in inset) are separated by 700 μm. The measured voltage versus current at room temperature is also shown in FIG. 13A and exhibits a linear relationship (N-UNCD shows ohmic contact with most metals). This figure also shows the voltages curves with and without contact resistance, yielding resistances of 487 and 50, respectively. The minimum current for which a heating effect was noted during the resistance reading was 0.5 mA. These measurements were repeated with increasing temperature from 23° C. to 200° C. FIG. 13B shows the decrease in resistance as a function of increased temperature. By applying the following formula, $$a_0 = \frac{1}{R_o} = \left(\frac{R - R_o}{T - T_\varepsilon}\right) \quad (2)$$

$TCR_{(o)}$ was calculated to be $-0.000345°$ $C.^{-1}$. The negative value indicates typical semiconductor behavior, since the resistance decreases as a result of more charge carriers being thermally generated with increased temperature.

Figure 13C:
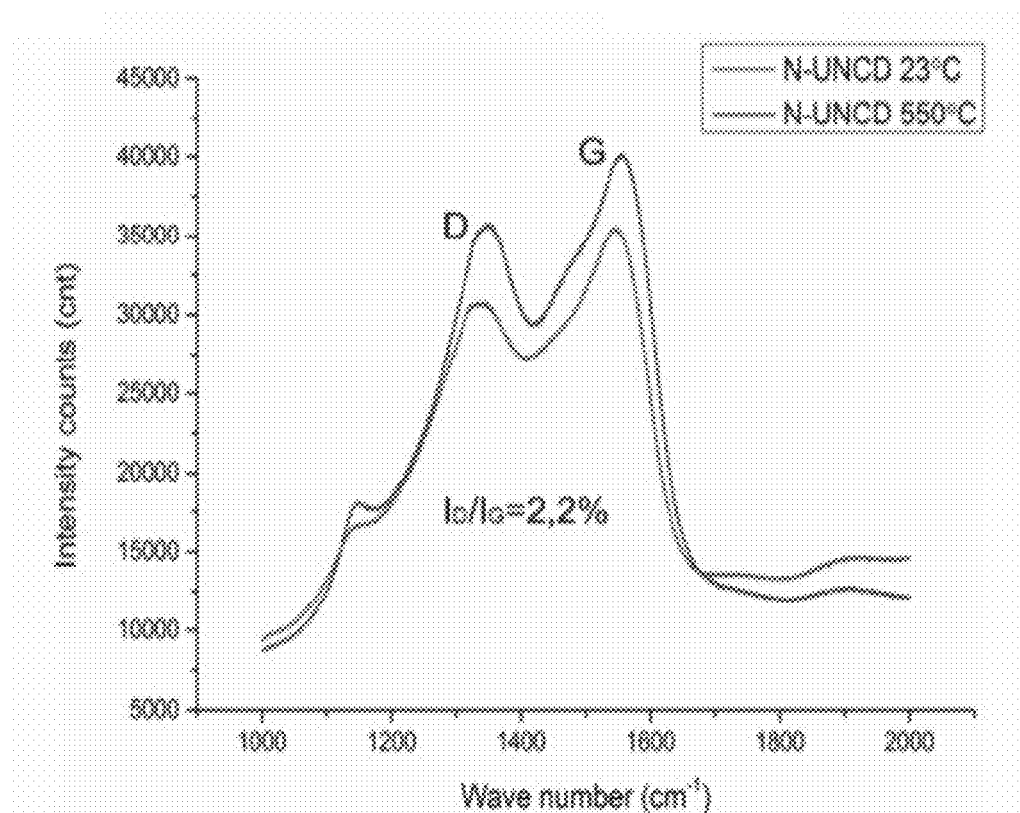
Figure 13D:
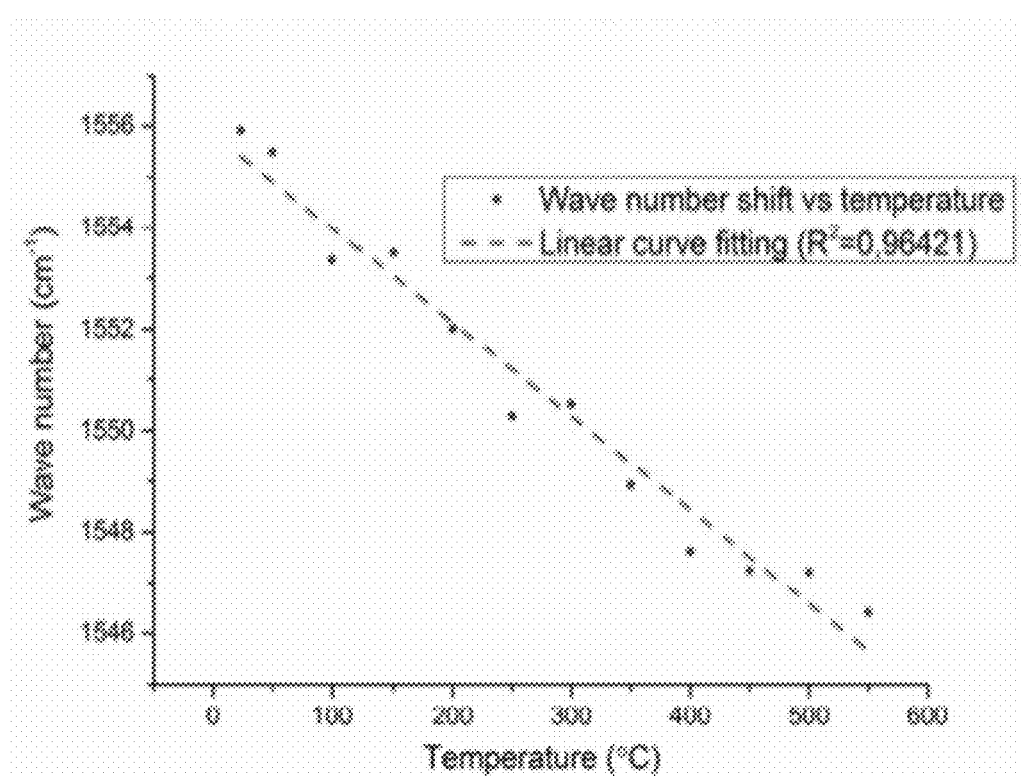
Figure 14A:
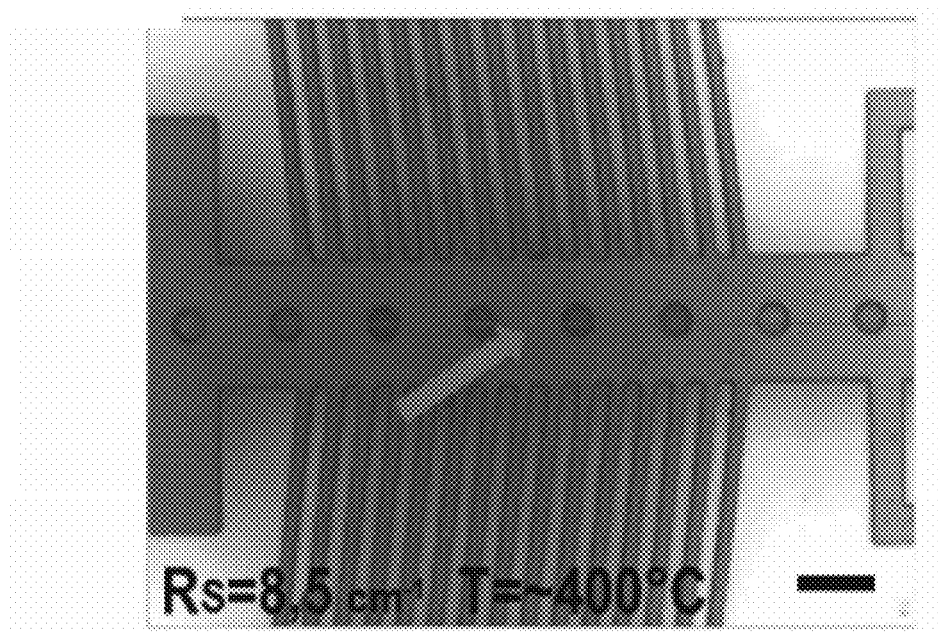
FIG. 14A-D shows temperature mapping of an implementation of a device.
Figure 14B:
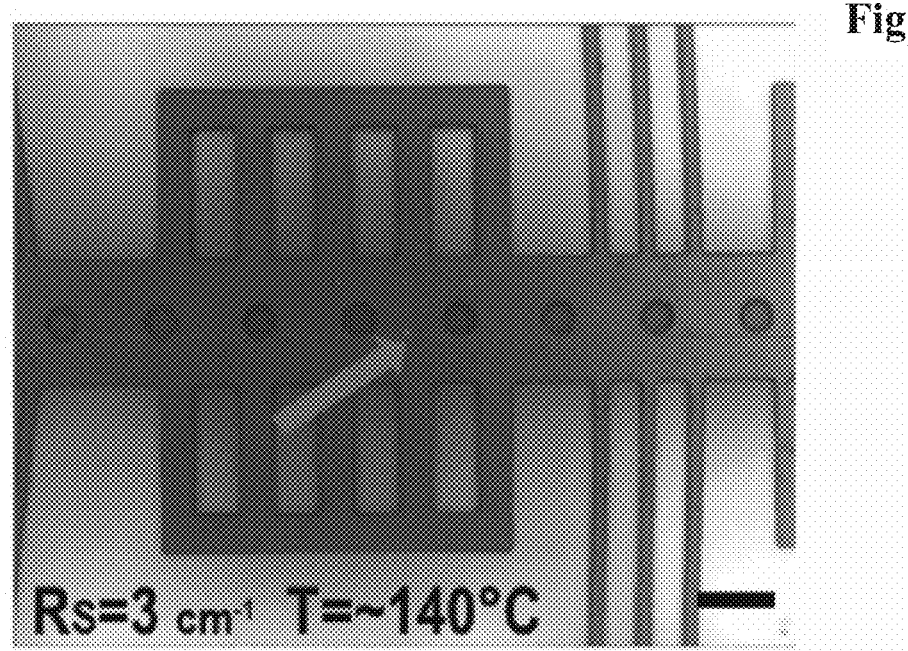
Figure 14C:
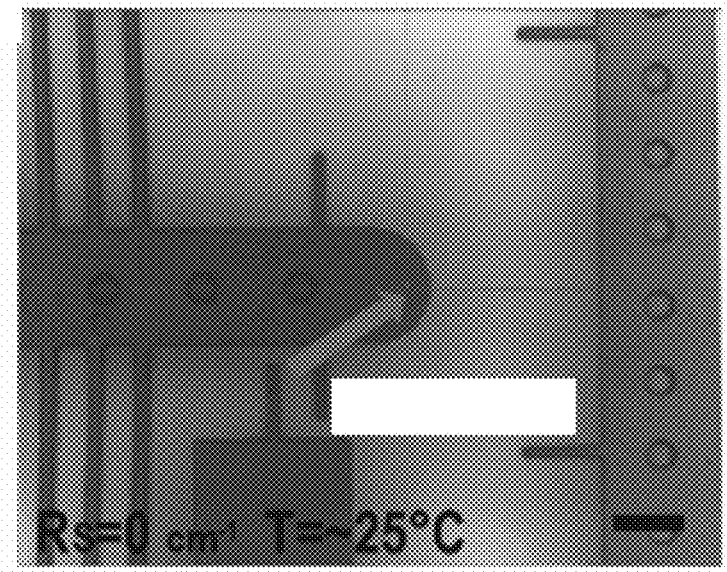
Figure 14D:
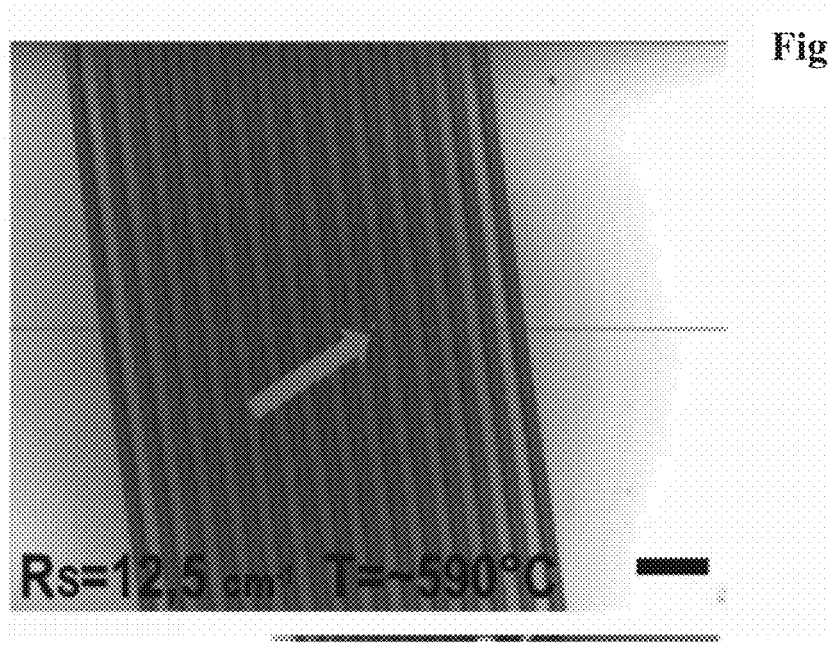

To obtain a spatially resolved temperature mapping of the thermal actuator, the Raman shift of the N-UNCD material was determined as a function of temperature. The shift of the Raman spectrum also confirmed the semi-metallic nature of the material. To that end, the same sample of FIG. 13A was positioned on a heating stage capable of a maximum temperature of 550° C. The sample was analyzed with a micro-Raman spectroscope using a 488 nm wavelength laser source, with a CCD nitrogen-cooled detector at $-130°$ C. and with five iterations of data for 45-sec acquisition time. This procedure was necessary to reduce the noise and facilitate the data fitting and determination of the peak position in the spectra for the Raman shift. The N-UNCD Raman spectra obtained at room temperature and at 550° C. are displayed in FIG. 13C. The $sp^3$-bonded carbon (D) and $sp^2$-bonded carbon (G) bands are the most evident peaks in the N-UNCD spectra. No significant changes in the overall shape of the spectra is observed with the increased temperature, except for a weakening of the transpolyacetylene band at 1144 $cm^{-1}$ for the N-UNCD at 550° C. This difference suggests a loosening of hydrogenated bonding at the grain boundaries due to the higher temperature. In addition, the intensity ratio (ID/IG) between the D- and G-bands decreases by 2.58% at the high temperature, indicating the onset of the graphitization process, which is not yet in full force. An exact determination of the shift toward lower wavenumbers by increasing temperature is hindered by the broadness of those bands. To detect this shift with the highest possible accuracy, we monitored the change in position of a Gaussian fit of the G-band (FIG. 13D). The total shift of the G-band determined for N-UNCD for T=527° C. is 9.506 $cm^{-1}$, resulting in a temperature dependence of 0.018 $cm^{-1}C.^{-1}$, in accordance with the typical Raman shift range of most Raman active semiconductors.

Using the micro-Raman calibration method mentioned above, the temperature distribution along the devices as spatially resolved in real time was determined. A key factor in the decision to use N-UNCD for building thermal actuators is its low thermal conductivity coefficient (which strongly depends on the crystalline structure) and the amount of $sp^2/sp^3$ disorder. For N-UNCD a thermal conductivity of 8.6 to 16.6 $Wm^{-1}K^{-1}$ has been reported. FIGS. 14A-D show the four locations where the temperature was monitored by analyzing the Raman spectrum shift (Rs). The change in position of the G-band in the Raman spectrum was determined with a Gaussian fit of the data, and the temperature was calculated by using the results obtained from the micro-Raman calibration method mentioned before. From the slender beams to the front of the moving head, the temperature drops from 520° C. to 25° C. at full displacement.

Above a maximum electrical input power of ~180 mW, the device fails due to structural modification caused by reaction with oxygen in the air when the temperature of the angled beams peaks above 600° C. FIG. 15A shows the Raman spectra, taken on the beams, before (FIG. 15B) and after (FIG. 15C) failure. At room temperature, the signal corresponds to the typical N-UNCD signature, but when failure occurs, the spectrum reveals a modification of the sp3 bonds, indicating the onset of graphitization in the diamond phase. The graphitization is indicated by the shift towards higher wavenumbers of the G-band with respect to the G-band of N-UNCD spectrum, together with the sharpening of both of the main peaks.

The displacement of the thermal actuators as a function of the applied voltage has been measured in an optical displacement detection system with deep sub-nanometer resolution based on curve-fitting. Its operating principle is similar to image correlation, where a sequence of images of a moving structure is compared with a template image to determine at which shift of the template a 'best match' occurs. In the example system, the template image is replaced by a continuous mathematical function that describes the shape of the moving feature. The displacement at which the best match occurs is found by nonlinear curve-fitting.

Figure 16A:
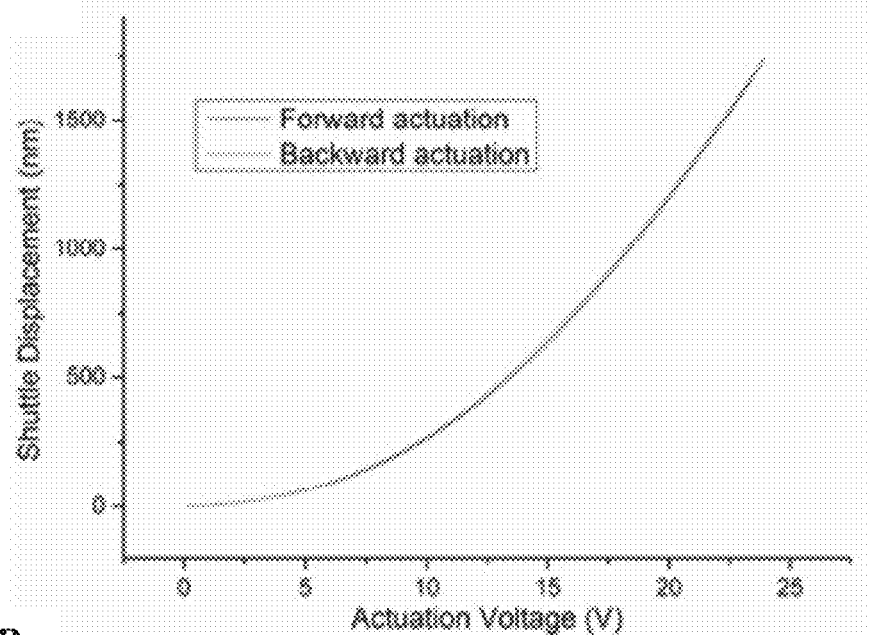
FIGS. 16A-C show displacement of an actuated N-UNCD MEMS.
Figure 16B:
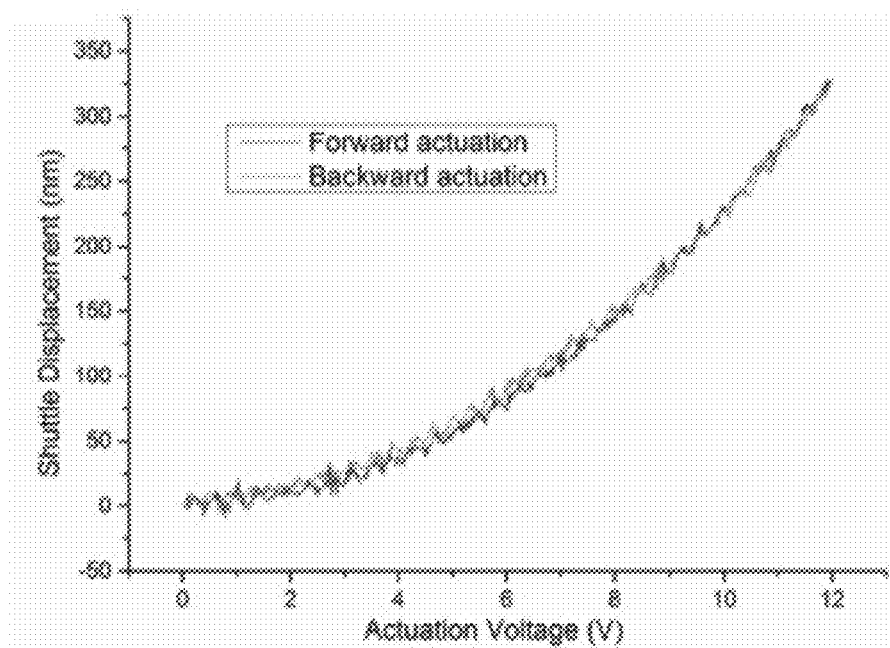
Figure 16C:
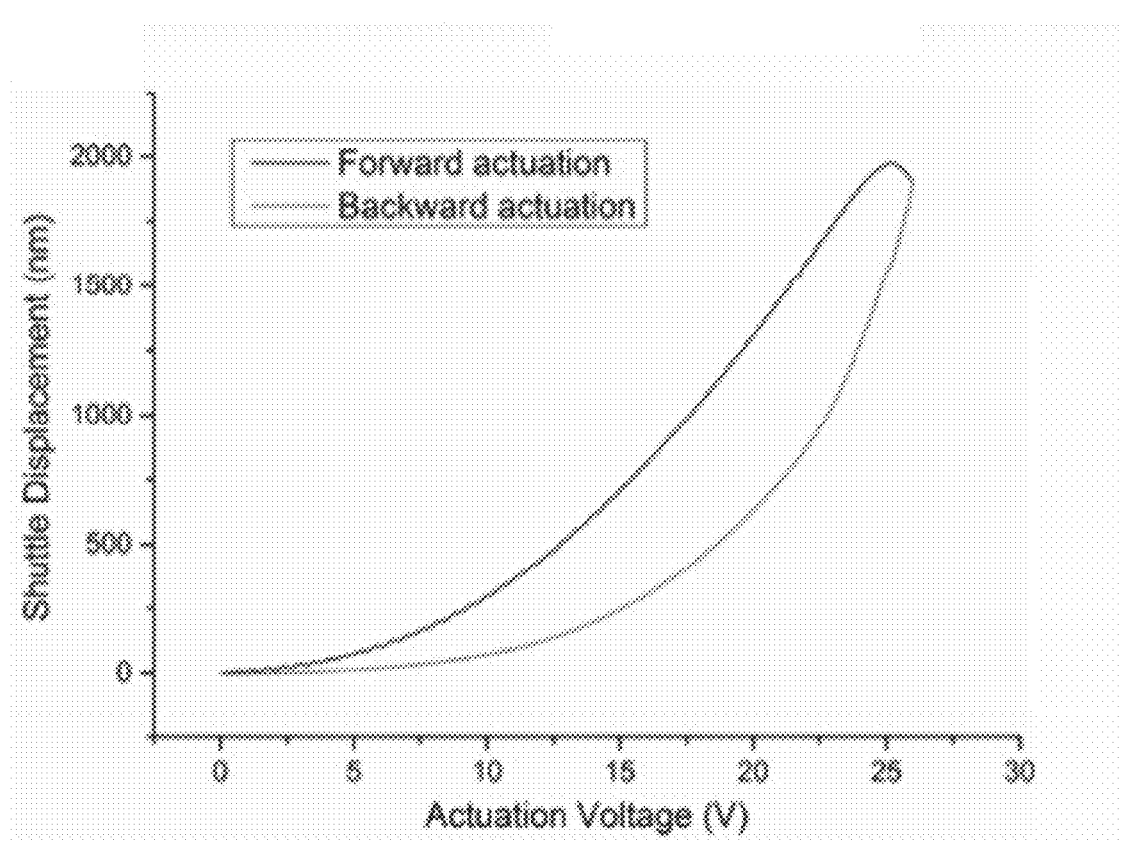

The ohmic contact with the bond pads was determined with gold-coated probe needles. The maximum displacement achievable is directly linked to the design of the slender beams and their thermal expansion coefficient. Two different devices were employed with different lengths and angles of the beams to prove that full position control can be achieved at the nanoscale, and that N-UNCD could be used to develop extremely high precision tools, such as nanogrippers or positioning stages. The maximum displacement was obtained with a 200-µm-long array of 15 slender beams under an angle of 7 degrees (FIG. 16A), while a shorter range of motion was achieved with a device based on the same concept but with 90-µm-long angled beams at 2.3 degrees, without supporting springs (FIG. 16B). To minimize the mechanical noise from the measurement and increase the positioning precision, we tracked the motion by subtracting the mechanical vibration of a standing marker from the profile of the moving beam. The higher noise level observable in the smaller actuator is due to the lack of that type of dedicated marker on the device. The actuation consists in a forward and backward displacement curve (FIG. 16C). To build each curve, 500 different positions are taken, for a total of 1000 points. The maximum displacement resolution was estimated to be 0.4 nm (one standard deviation). The markers, designed to track the motion, are positioned on the device in such a way that they are not affected by the increasing temperature, and the thermal expansion cannot be misinterpreted as the real displacement of the device. The measurements reveal that a N-UNCD MEMS device built with such geometries is capable of reaching displacements up to 1.980 µm (at 24 V) with a maximum input power of 170 mW, or in a smaller range, up to 350 nm (at 12 V), with high repeatability and accuracy in performance and failure conditions. Similar kind of thermal actuator based on silicon has been reported by Zhu et al.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of fabricating a device comprising:
depositing, by vapor deposition, nitrogen doped ultrananocrystalline diamond (UNCD) and boron or nitrogen dopant, forming, by in-situ incorporation a nitrogen doped ultrananocrystalline diamond (B/N-UNCD);
depositing a layer of depositing a layer of a carbide-forming metal on the(B/N-UNCD); and
exerting a tensile stress by the carbide-forming metal, tuning the internal stress properties of the device by controlling deposition thickness of the carbide forming metal.

2. The method of claim 1, wherein the carbide forming metal is titanium.

3. The method of claim 1, wherein a dopant in the doped B/N-UNCD is nitrogen (N-UNCD).

4. The method of claim 3, wherein the device is a nano/micro-electro mechanical device (MEMS).

5. The method of claim 3, further comprising
fabricating the MEMS by: depositing an oxide layer on a silicon base;
depositing a tungsten layer on the oxide layer;
depositing the N-UNCD on the tungsten layer
depositing a Ti layer on N-UNCD; and
etching to form the MEMS.

6. The method of claim 5, further comprising tuning the internal stress properties of the device by controlling deposition thickness of the Ti layer.

7. The device of claim 1, wherein the N-UNCD layer is 3 microns to 4 microns thick.

8. The device of claim 1, wherein the carbide layer has a thickness of about 50 nm.

9. A device comprising:
a silicon base;
an oxide layer;
a conductive nitrogen doped ultrananocrystalline diamond (N-UNCD) layer of 3 microns to 4 microns; and
a titanium carbide layer deposited on the N-UNCD layer, the titanium carbide layer exerting a tensile stress on the N-UNCD layer;
wherein the residual stress of the titanium carbide layer and N-UNCD layer is about zero.

10. The device of claim 9, further comprising a tungsten layer.

11. The device of claim 9 wherein the device is a nano/micro-electro mechanical device (MEMS).

12. The device of claim 11, wherein the MEMS device comprises a thermal actuator.

13. The device of claim 12, wherein the MEMS device exhibits a maximum displacement (in a linear direction) of 8 microns and a minimum step resolution of 0.4 nm.

14. The device of claim 11, wherein the titanium carbide layer has a thickness of 30-50 nm.

15. The device of claim 11, wherein the device exhibits negligible in-plane stress.

16. The device of claim 9, further comprising the doped N-UNCD layer and an un-doped UNCD layer.

17. A nano/micro-electro mechanical (MEMS) device comprising:
 a non-conductive base;
 a laterally movable conductive thermal actuator disposed on the non-conductive base, the actuator comprising doped ultrananocrystalline diamond (UNCD);
 wherein the UNCD exhibits negligible in-plane stress.

18. The device of claim 17, wherein the conductive thermal actuator is a chevron actuator comprising nitrogen or boron doped N-UNCD.

* * * * *